United States Patent
Mohammed et al.

(10) Patent No.: US 6,466,050 B1
(45) Date of Patent: Oct. 15, 2002

(54) METHOD TO IMPROVE ROUTABILITY IN PROGRAMMABLE LOGIC DEVICES VIA PRIORITIZED AUGMENTED FLOWS

(75) Inventors: Haneef D. Mohammed, Beaverton; Joseph P. Skudlarek, Lake Oswego, both of OR (US); Bing Tian, San Jose, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 09/894,220

(22) Filed: Jun. 27, 2001

(51) Int. Cl.$^7$ .............................................. H03K 19/177
(52) U.S. Cl. .............................. 326/38; 326/39; 326/41
(58) Field of Search ................................ 326/38, 39, 41

(56) References Cited

U.S. PATENT DOCUMENTS 6,181,162 B1 * 1/2001 Lytle et al. ..................... 326/41
6,269,470 B1 * 7/2001 Paz ............................. 716/12

* cited by examiner

Primary Examiner—Michael Tokar
Assistant Examiner—Anh Tran
(74) Attorney, Agent, or Firm—Wagner Murabito & Hao LLP

(57) ABSTRACT

A method and system for routing signals through interconnect matrices in a programmable logic device such that downstream routing failures can be reduced. In one embodiment, the invention is used to improve routing in complex programmable logic devices or CPLDs, however, the invention can be applied to other programmable devices and routing resources. In routing a set of signals through an upstream interconnect matrix or PIM, the method determines a set of high priority signals. In routing the upstream PIM, the method uses a Maximum Bipartite Matching process in one embodiment to route the original signals once. The duplicated high priority signals are then routed and sent to the input array of the downstream interconnect matrix along with the originally routed signals. From the originally routed signals and the duplicate signals, the downstream interconnect matrix routes each unique signal once and only once depending on the available routing resources. The method also uses a technique for preventing the simultaneous routing of duplicate signals through the downstream interconnect matrix and ensuring that one, and only one, copy of any signal arrives at the destination output array.

23 Claims, 10 Drawing Sheets

METHOD TO IMPROVE ROUTABILITY IN PROGRAMMABLE LOGIC DEVICES VIA PRIORITIZED AUGMENTED FLOWS

FIELD OF THE INVENTION

The present invention relates to a method for improving the success of signal routing during the physical synthesis of programmable logic devices.

BACKGROUND OF THE INVENTION

Various programmable logic architectures are known, including, for example, programmable logic devices ("PLDs"), programmable logic arrays ("PLAs"), complex programmable logic devices ("CPLDs"), field programmable gate arrays ("FPGAs") and programmable array logic ("PAL"). Although there are differences between these various architectures, each of the architectures typically includes a set of input conductors coupled as inputs to an array of logic gates (e.g., a product term array made up of logical AND gates), the outputs of which, in turn, act as inputs to another portion of the logic device.

Complex Programmable Logic Devices ("CPLDs") are large scale PLDs that, like all programmable architectures, are configured to the specific requirements of an application by programming. A typical programmable logic device consists of one or more logical clusters, each containing one or more logic blocks, one or more memory modules, and an internal bus to carry signals, all connected by one or more Programmable Interconnect Matrices ("PIMs"). In some CPLDs, high level channels connect the clusters to each other and to external devices. The connections made in a PIM are determined by routing software.

The signals that need to route to a Logic Block PIM are determined by the desired configuration of the device and the logic inside the logic block. Some of these signals are carried in the top-level horizontal and vertical routing channels that surround the cluster. There are channel-to-cluster PIMs connecting the routing channels to the cluster internal bus. Conventional routing software routes these signals through the channel-to-cluster PIMs, which sends these signals onto a particular set of wires in the cluster bus. Then the routing software routes through the Logic Block PIMs to send the signals into the logic blocks toward their final destination.

Routing of the input set to the output set through a PIM can be defined as a "Maximum Bipartite Matching" problem, and use a standard network-flow based solution. See, for example, the reference entitled "Introduction to Algorithms" by Cormen, Leiserson and Rivest, 1990 p. 600, which is incorporated herein as background.

The operation of a conventional routing process can best be visualized by reference to conventional art FIGS. 1, 2 and 3. FIG. 1 illustrates a schematic representation of a logical cluster and associated PIMs. Signals 308, carried in channel 206, are selected and routed through channel-to-cluster PIM 205 into cluster 201, then routed by logic block PIM 204 into logic block 255.

The logical operation of a conventional process is illustrated by conventional art FIGS. 2 and 3. Source node 301 represents the set of input signals and input node array 303 represents the arrangement of signals at the PIM input. Note that a PIM is represented here as the combination of input node array set 303, interconnect matrix 305 and output node array set 306. Pathways are determined through interconnect matrix 305 from input to output. The resultant connection graph is illustrated by FIG. 3. The signal present at input node 313 has been successfully routed to output node 316 and the signal present at input node 343 has been successfully routed to output node 336 via pathways 402.

The conventional processes used in the routing software route the signals through a PIM with each signal being routed to exactly one output. In a typical CPLD, the routing software first routes the "upstream" channel-to-cluster PIM 205 (FIG. 1), then the "downstream" Logic Block PIM 255. Logic block PIM routing is limited to routing a given set of signals represented only once in the set of wires as determined by the routing of the channel-to-cluster PIMs.

In the conventional art, there can be many routing failures because the limited routing resources are not always able to provide a path for all required signals. Typical routing failures occur in routing the Logic Block PIMs inside the cluster. This is due to the nature of the interconnection pattern of the PIM. A given set of signals, each on a particular wire, might not be able to be routed through a PIM since a routing solution for one signal, due to its location in the input set, may use routing resources necessary to the only routing solution available to another signal in the set. The set of input wires the signals occupy are fixed by the routing of the Channel-To-Cluster PIMs. Routing of Channel-To-Cluster PIMs is done without knowing whether Logic Block PIMs downstream can route or not, and this cannot be known at the time the channel-to-cluster PIM is routed. Hence, there is always some probability in the conventional art that a routing solution in the upstream PIM, 205, will induce a routing failure in the downstream PIM, 255. What is required, then, is a method for routing signals in the interconnect matrices of programmable logic devices that reduces the occurrence of routing failures.

SUMMARY OF THE INVENTION

A method and system thereof are described herein for routing signals through interconnect matrices in a programmable logic device such that downstream routing failures can be reduced. In one embodiment, the invention is used to improve routing in complex programmable logic devices or CPLDs, however, the invention can be applied to other programmable devices and routing resources.

In routing a set of signals through an upstream interconnect matrix or PIM, the novel method determines a set of high priority signals. The process routes a set of original signals through the upstream PIM so that all signals are routed once and only once. Then the process routes the high priority signals (as many as possible) such that they are duplicated at the output of the upstream PIM. In routing the upstream PIM, the method uses an augmented Maximum Bipartite Matching process (maximum flow) in one embodiment where some signals (high priority signals) are routed twice. Specifically, the high priority signals are re-introduced to existing input nodes of the graph and then path finding steps are performed to locate forward paths through the upstream PIM to additional output nodes, represented in the graph, for the duplicate signals. These duplicated high priority signals are then sent to the input array of the downstream interconnect matrix along with the originally routed signals.

The downstream interconnect matrix can then route the originally routed signals or the duplicate signals depending on position in the input array set and the available routing resources. The method also uses a technique for preventing the simultaneous routing of duplicate signals through the downstream interconnect matrix and ensuring that one, and only one, copy of any signal arrives at the destination output array. Specifically, for each duplicate signal, a virtual node is inserted in a graph between the source node and the input nodes, where the virtual node ensures that each duplicate signal is routed only once. Then, forward paths are determined through the graph to output nodes for each unique signal. Signals are routed once, and only once, this way. The routing failures attendant to conventional routing are thus reduced significantly, if not eliminated.

In one embodiment, the method comprises the steps of selecting highest priority original signals for duplication, routing all signals once through a first interconnect matrix and then routing the duplicated signals through unused pathways remaining in the first interconnect matrix. Then the method includes the steps of routing the signal outputs resulting from the first interconnect matrix through a second interconnect matrix. This second routing comprises the steps of routing all signal outputs, allowing both original and duplicate through the second interconnect matrix and each successfully routed signal is then prevented from being duplicate routed in the second interconnect matrix such that only unique signals are routed, once and only once, through the second interconnect matrix.

BRIEF DESCRIPTION OF THE DRAWINGS

The operation of this invention can be best visualized by reference to the drawings.

DETAILED DESCRIPTION

Figure 1:
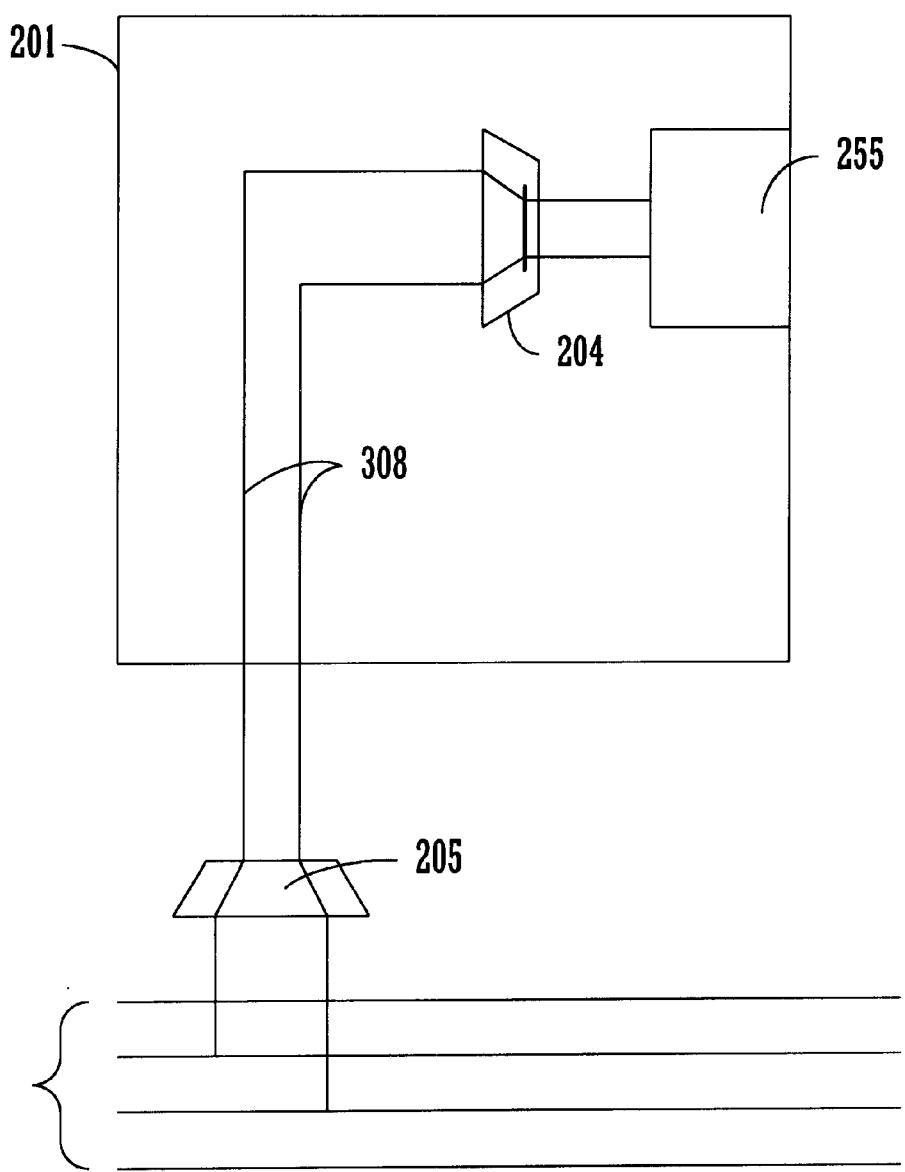
FIG. 1 schematically illustrates the conventional process of signal routing through the Channel-to-Cluster PIM and subsequent routing through the Logic Block PIM.
Figure 2:
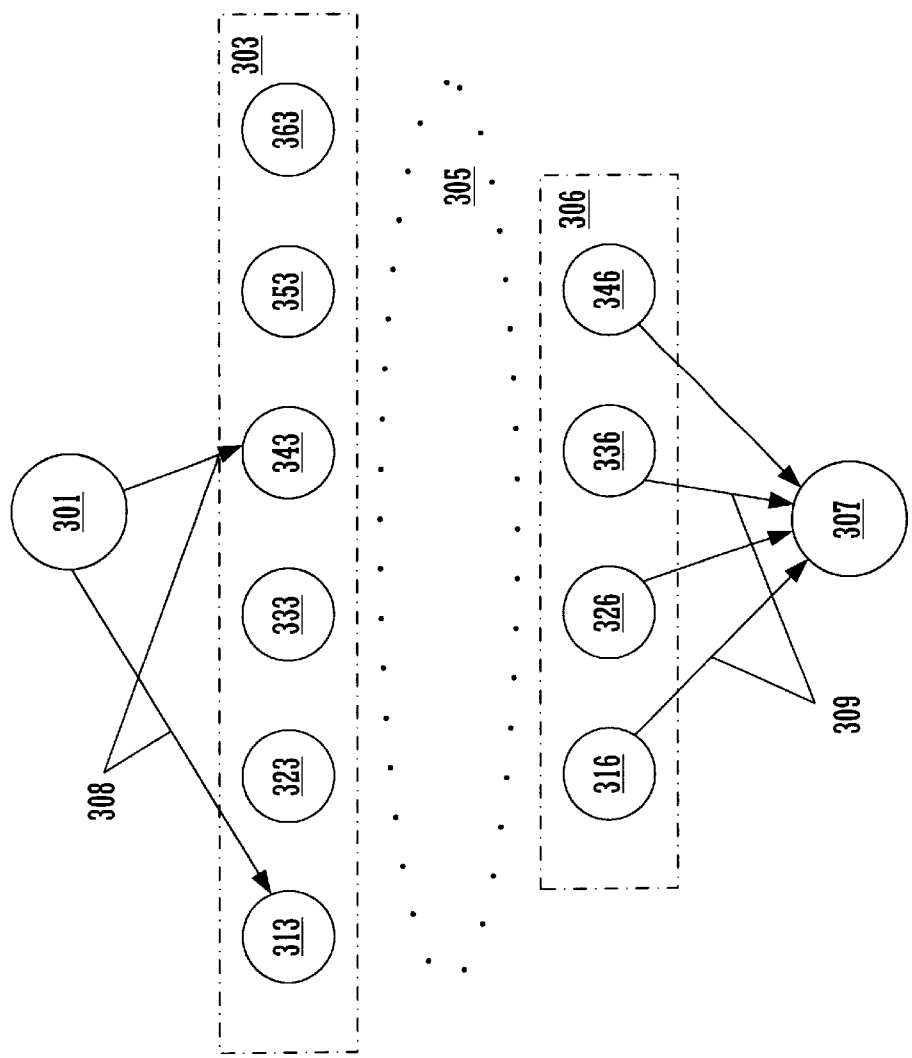
FIG. 2 logically illustrates the conventional routing "graph" of the Channel, PIM, Cluster configuration as envisioned by a Maximum Bipartite Matching routing process.
Figure 3:
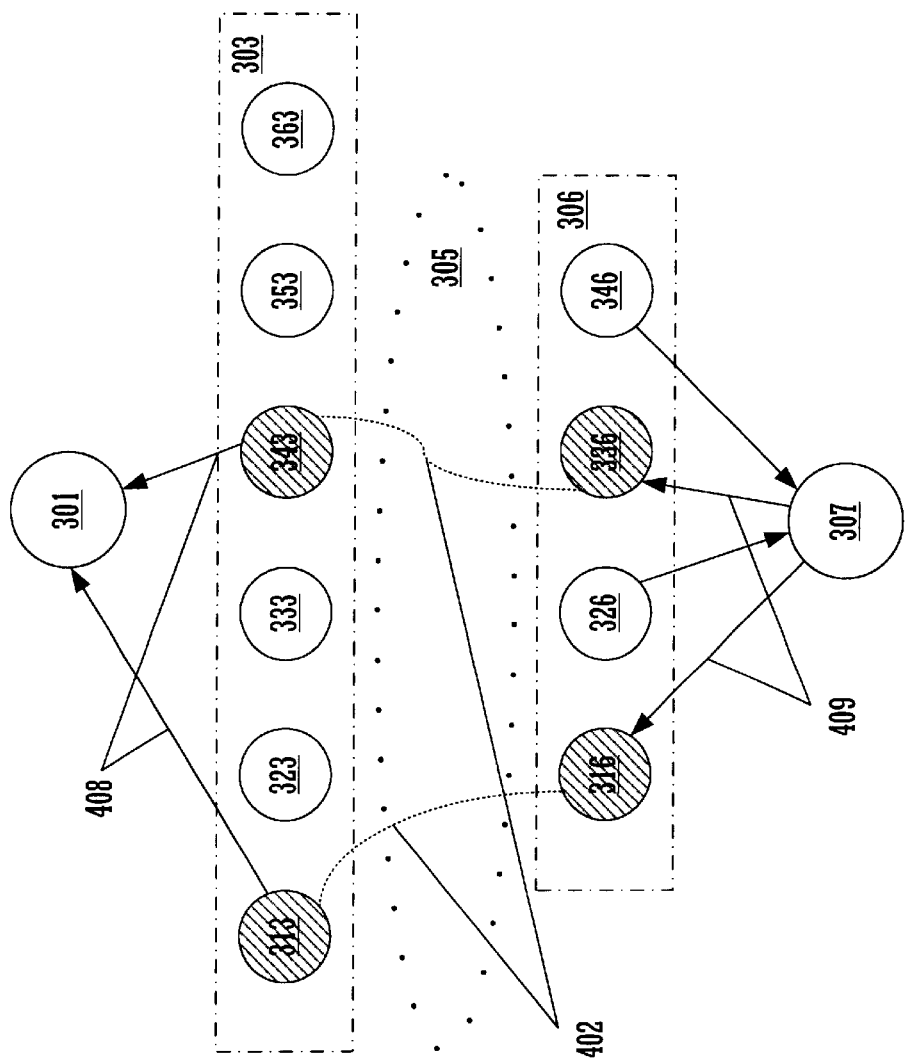
FIG. 3 logically illustrates the conventional routing graph after PIM routing is completed.

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Some portions of the detailed descriptions that follow are presented in terms of procedures, processing, and other symbolic representations of operations on data bits within a computer memory. These descriptions and representations are the means used by those skilled in the data processing arts to most effectively convey the substance of their work to others skilled in the art. A procedure, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, bytes, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "generating," "detecting," "translating," "changing", "routing", "duplicating" or the like, refer to the action and processes (e.g., process 1100 of FIG. 10) of a computer system or similar intelligent electronic computing device, that manipulates and transforms data represented as physical (electronic) quantities within the computer system's registers and memories into other data similarly represented as physical quantities within the computer system memories or registers or other such information storage, transmission or display devices.

Described herein is one embodiment of a routing method for routing signals in programmable logic devices, for example, complex programmable devices ("CPLDs"). This method includes a mechanism of avoiding interconnect matrix routing conflicts by providing upstream alternative signal locations, thus providing alternative routing solutions downstream.

It is noted that the present invention may be implemented in any of a variety of routing resources. However, the embodiment of the present invention discussed herein is best discussed in application to the task of configuration of CPLDs.

Figure 4:
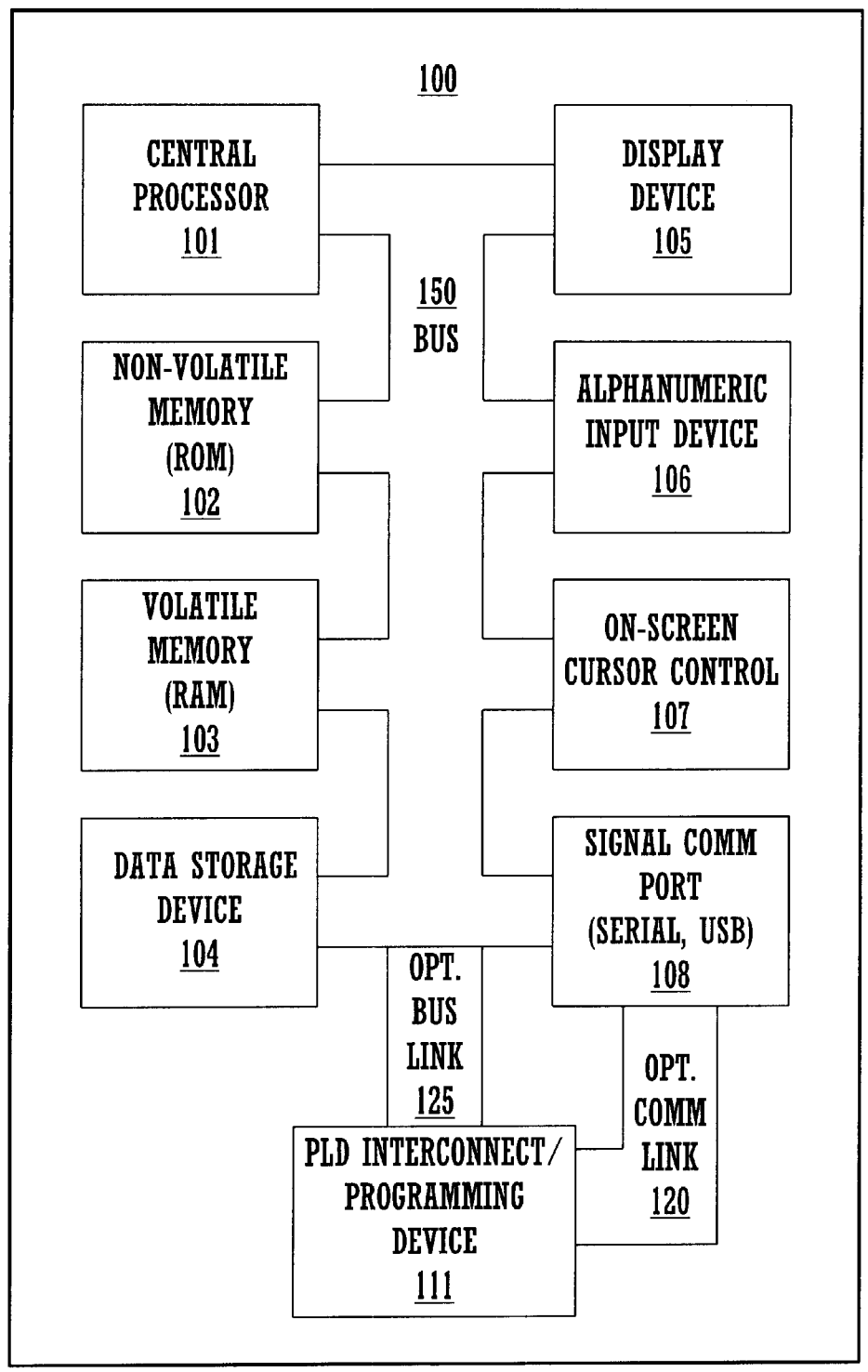
FIG. 4 shows the configuration of a typical computer that would be required to implement one embodiment of the present invention.

CPLD configuration is typically accomplished through the use of configuration software. Such software is run on computers such as that illustrated in FIG. 4. As shown, a general purpose computer comprises bus 150 connecting processor 101, non-volatile ROM 102, RAM 103 and some form of data storage 104, all contained within optional enclosure 100. The computer also likely comprises an optional display device 105, some form of user input such as keyboard 106 and cursor control 107 and possibly other signal input/output circuits 108. In order to configure a programmable logic device, such as a CPLD, the computer would also require some means of communication with a PLD, such as that represented in FIG. 4 as PLD interconnect/programming device element 111. Element 111 is shown with possible connections to both the internal computer bus 150 via bus link 125 and, by communications link 120, to input/output element 108. This is to illustrate that there are numerous ways in which a configuring computer may communicate with a PLD being configured.

In the embodiment described here, a routing process in software, based on the needs of the end result configuration, configures the CPLD by selecting signal routes through sequential, programmable, interconnect matrices (PIMs). In one embodiment, a PIM connects desired signals from a high level "channel" to route them into each logical "cluster" via the cluster bus. Another PIM, the Logic Block PIM, further routes the signals into logical units within the cluster. The sequential relationship between the two PIMs discussed here allows application of the terms "upstream" PIM to the channel-to cluster PIM and "downstream" to the logic block PIM. This interchangeability of terms will apply even though actual electrical signal travel direction may not be from upstream to downstream. Note, too, that the terms sequential relates to a logic flow relationship and not necessarily to a temporal one. It is possible in some implementations that a routing solution could be sought in both PIMs simultaneously.

Figure 5:
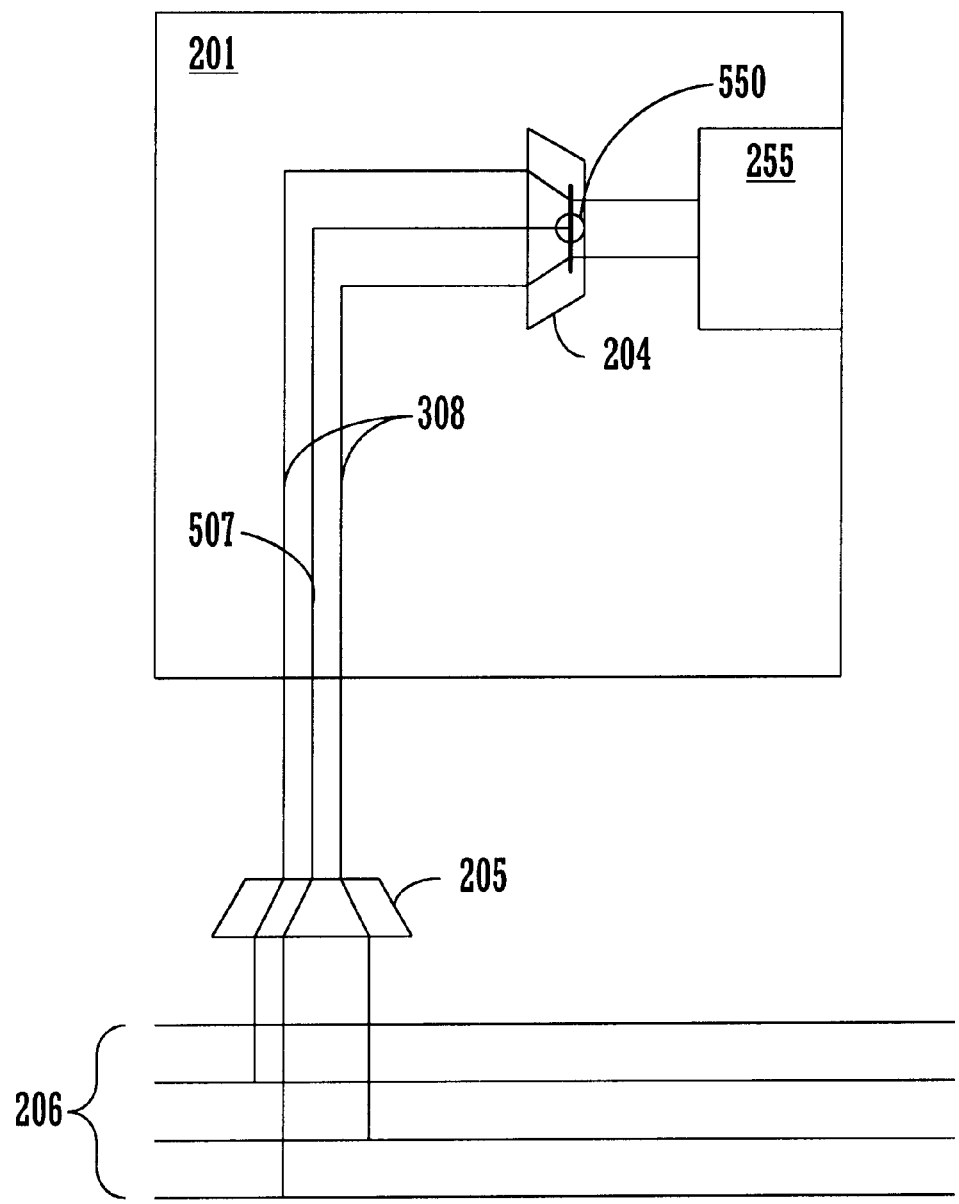
FIG. 5 schematically illustrates completed signal routing from channel to cluster and a failed routing in the logic block PIM.

FIG. 5 illustrates the routing process in schematic form. Signals are carried on wires in channel 206. Channel-to-cluster PIM 205 selects signals from the channel 206 based on the requirements of the desired end result and routes them into cluster 201. It is appreciated that Channel-to-Cluster PIM 205 and Logic Block PIM 204 both have many more inputs than outputs. Logic block PIM 204 then routes input signals 308 to the desired connections in logic block 255. A routing failure is illustrated in FIG. 5 by signal 507 which, though successfully routed through channel-to-cluster PIM 205, fails to successfully route through logic block PIM 204, at site 550.

Figure 6:
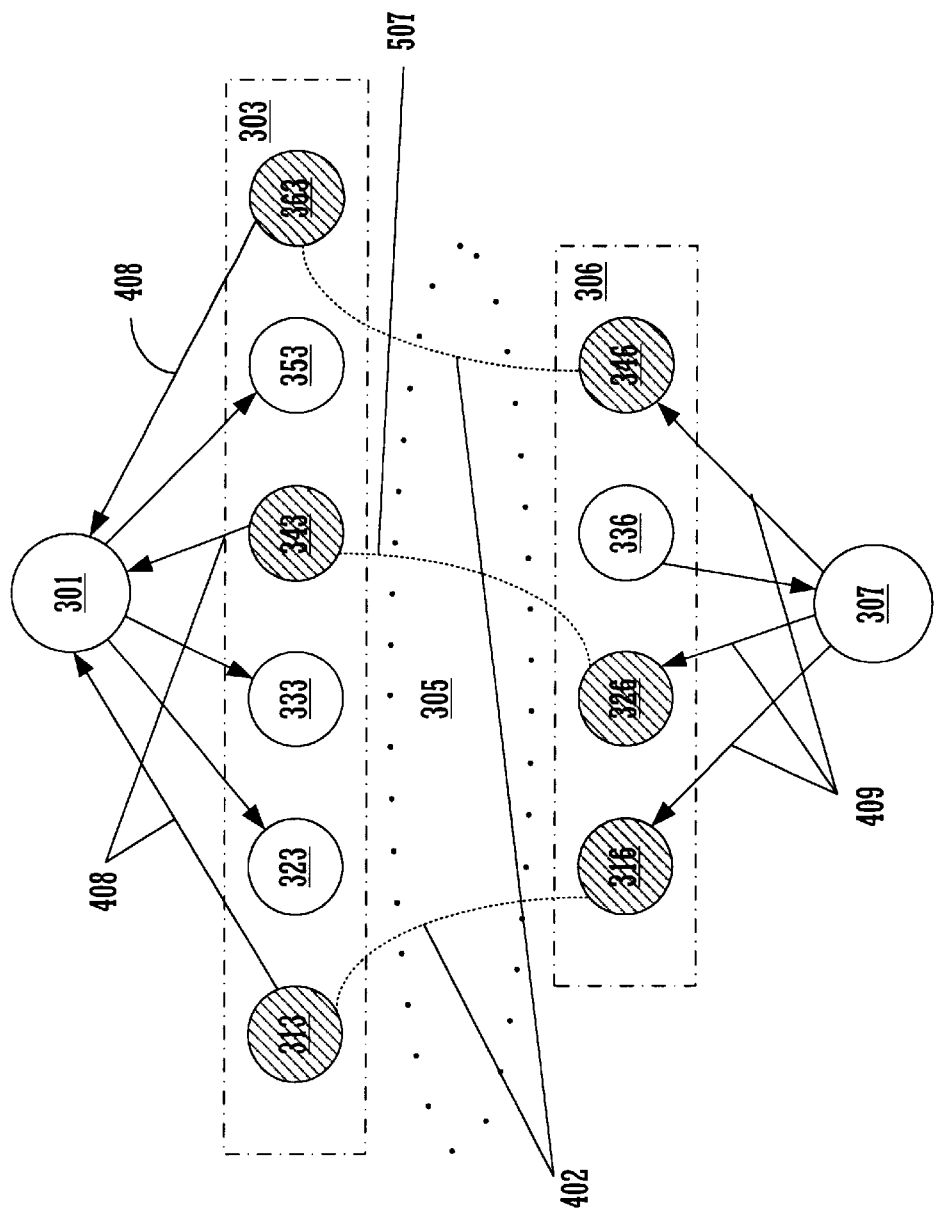
FIG. 6 is a logical illustration of a routing solution in the channel-to-cluster PIM in the conventional routing process.

The routing process routes each desired signal, using Maximum Bipartite Matching techniques which are well known in the art. The logical operation of the routing process employed in the routing software is illustrated by FIG. 6, which shows one representation of a maximum bipartite matching graph. FIG. 6, in essence, shows a logical representation of the routing process as applied to channel-to-cluster PIM 205. Logical source node 301 is the origin of the set of input signals 408. Source node 301, and sink node 307, do not physically exist but are representative of how the signal source and sink are implemented in the routing process. The signals are present on input node array set 303. The signals to route are represented by directed "edges" from the source node 301 to the inputs in the configuration program's routing graph. Here the active input nodes, those with signals requiring routing, are 313, 343 and 363. Each signal can be routed once.

It must be noted here that the application of maximum bipartite matching as discussed herein is not limited to programmable logic devices. However, such devices lend well to the discussion of this embodiment of the present invention.

Importantly, FIG. 6 illustrates a solution to the maximum bipartite matching problem as it can be applied to a PIM or to a combination of PIMs. The routing process, a maximum flow process, seeks a solution that routes all signals present in the input array set 303 once and only once. A failure to find a solution results in a routing failure, stopping the process. Typically, solutions are found that leave some routing resources in the upstream PIM (channel-to-cluster PIM in the example discussed here) unused. As described more fully below, duplicated high priority signals are then routed again through the upstream PIM 205.

Routing of the logic block PIM (204 in FIG. 5) can also be accomplished in a maximum bipartite matching solution. However, the array of signals input to the logic block PIM is fixed by the solution to routing of the upstream, channel-to-cluster PIM, which has a great bearing on available solutions for the downstream PIM.

Prior to the present invention, routing failures could occur because, even though routing through the channel-to-cluster PIM 205 was successful, the relative positions of signals in the input signal array to the downstream logic block PIM 204 were fixed. If a signal was in a position in the logic block PIM input array set that resulted in the process' inability to find a routing solution, routing failure would occur. Signal 507, in FIG. 5, illustrates this type of failure. In this example, though successfully routed through upstream PIM 205, pathways 402 have used resources in downstream PIM 204 that are part of the only path available to route signal 507. The embodiment of the present invention described herein provides a method by which occurrences of these types of routing errors can be reduced.

To avoid having a routing blockage at downstream logic block PIM 204, such as that shown at 550 in FIG. 5, routing of upstream channel-to-cluster PIM 205 includes some further steps. Generally, high priority signals (of the set of channel signals) are selected. These high priority signals are routed again through the upstream PIM 205. Namely, an augmented Maximum Bipartite Matching Process is used wherein (1) the high priority signals are re-introduced to existing input nodes of the graph and (2) path finding steps are performed to locate forward paths through the upstream PIM 205 to additional output nodes, represented in the graph, for as many of the duplicate signals as can be routed.

Figure 7:
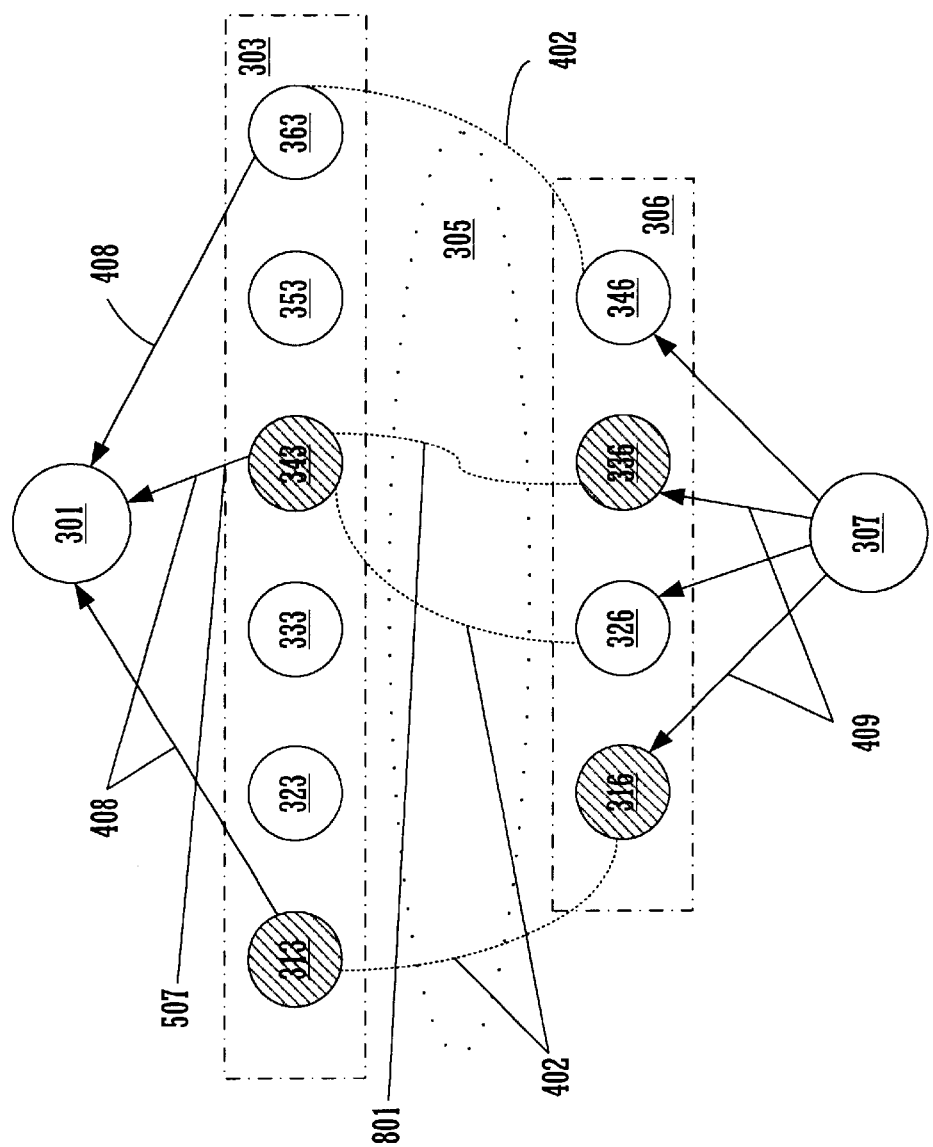
FIG. 7 logically illustrates the first part of a solution to a common routing failure in accordance with one embodiment of the present invention.

An example is shown in FIG. 7. In addition to complete routing of pathways 402 through channel-to-cluster PIM 205, high priority signal 507 is duplicated at the output array by using available resources to route them both from input node 343 to output node 336 and from input node 343 to output node 326. Logical directed edges 408 and 409 are reversed as usual in the maximum bipartite matching graph for each unit of flow in the solution. In this case, the high priority signals 507 is represented twice (node 326 and 336) at the output of the upstream PIM 205.

Figure 8:
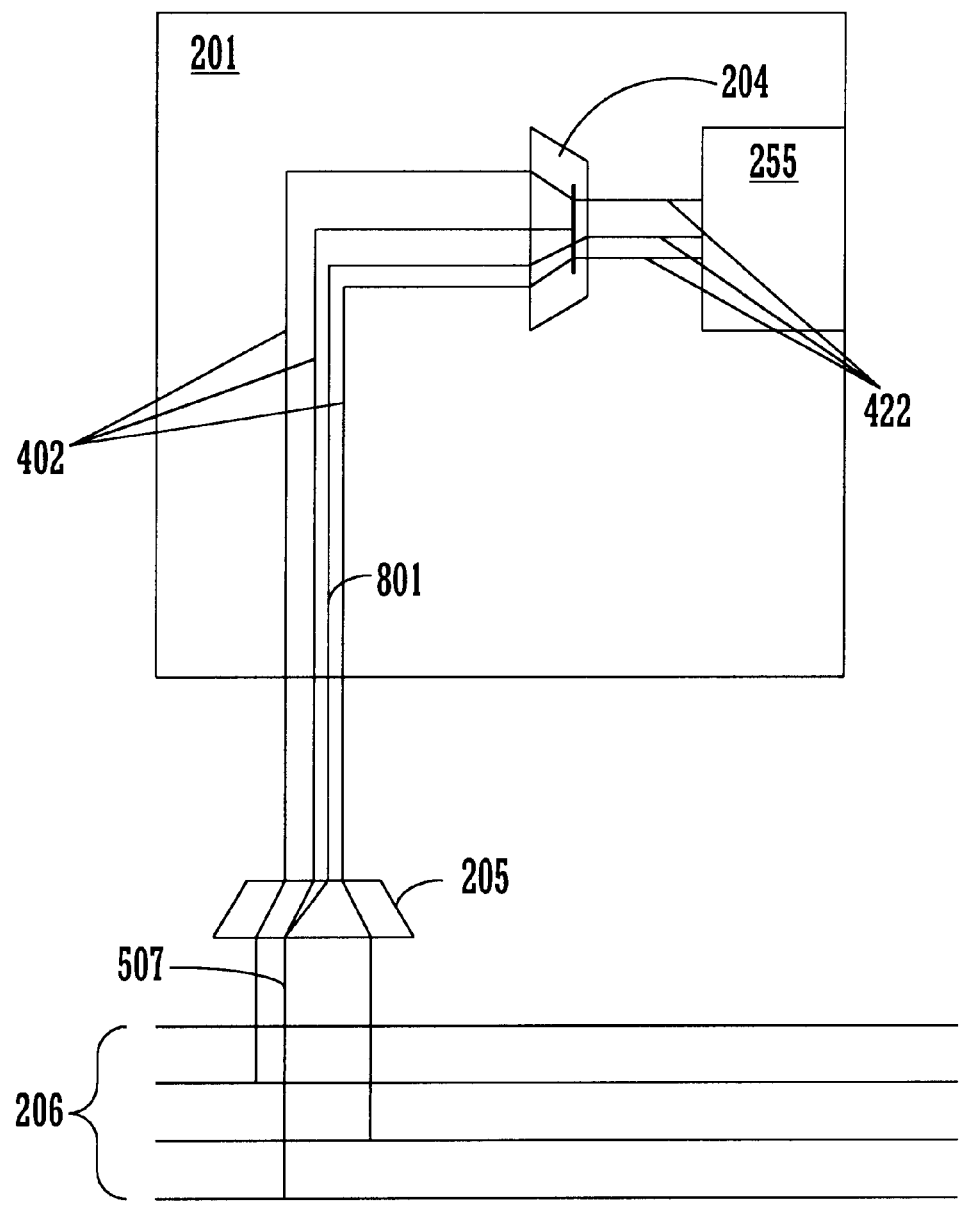
FIG. 8 schematically illustrates a solution in accordance with one embodiment of the present invention.

FIG. 7 shows an additional pathway 801 through graph matrix 305 representing upstream PIM 205. The identical signal is present on output node 326 via routing pathway 402 and on output node 336 via routing pathway 801. This duplication presents two copies of the same signal 507 to the input array of logic block PIM 204 as illustrated schematically in FIG. 8. Here one copy of signal 507, via upstream pathway 402, fails to route through downstream PIM 204 but the other, unduplicated, signals are routed successfully, as well as the other copy of signal 507, via alternative upstream pathway 801 and downstream pathways 422.

Routing through the downstream PIM 204 is now discussed. The present invention routes each unique signal (of the signals output from the upstream PIM 205) through the downstream PIM 204 once and only once. This is done using a augmented Maximum Bipartite Matching process that (1), for each duplicate signal, inserts a virtual node in a graph between the source node and the input nodes, wherein the virtual node ensures that each duplicate signal is routed only once and (2) determines forward paths through the graph to output nodes for each unique signal.

Figure 9:
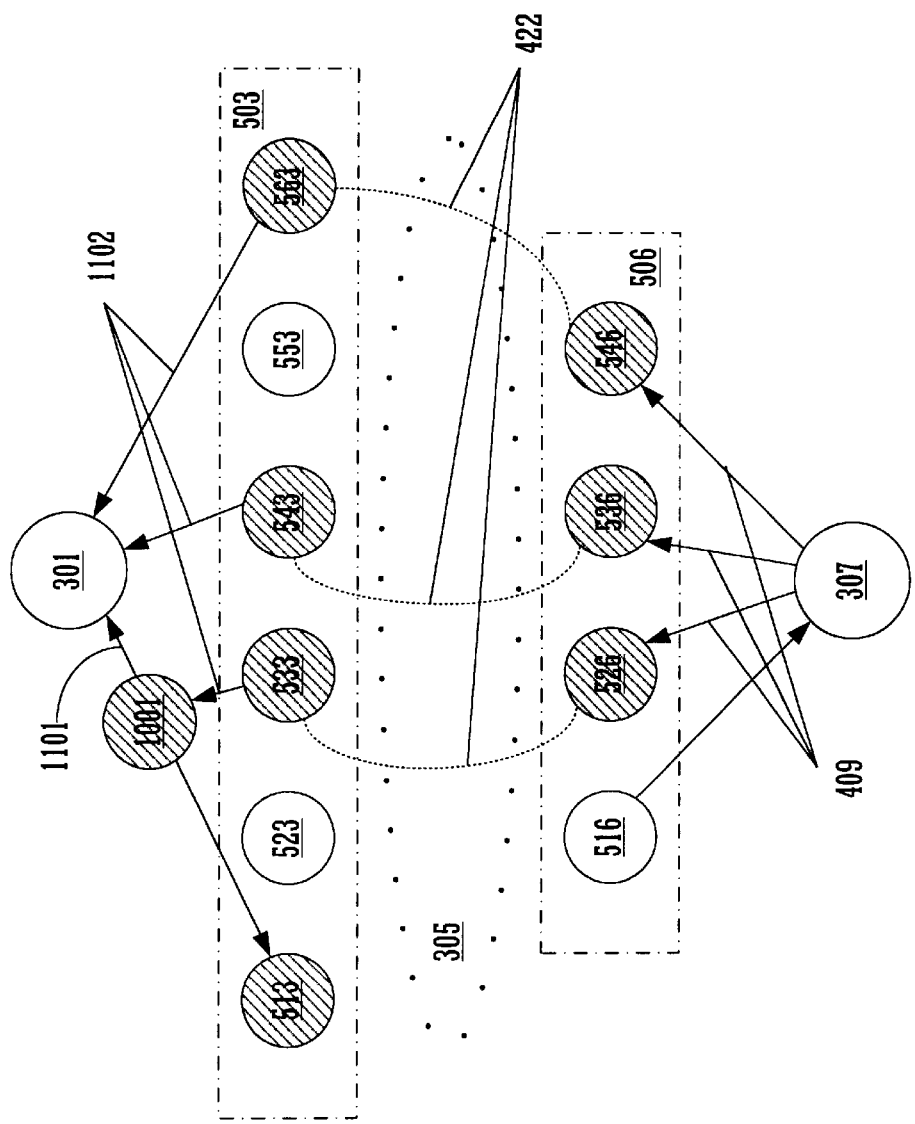
FIG. 9 illustrates, logically, the implementation of the solution in an embodiment of the present invention.

Without these further steps, the routing process would attempt to find a solution routing two copies of the same signal through the logic block PIM 204. The means provided by the present invention by which the above is prevented is shown in FIG. 9. When a signal is duplicated through upstream PIM 205, virtual node 1001 is inserted in the routing graph logically representing the downstream PIM, or other routing resource. Then, when the first successful max flow solution found involving either signal, the process's reversed edge 1101 takes place between virtual node 1001 and source node 301. This prevents the process from finding a solution to the maximum bipartite problem that includes a duplicated pathway for the same signal. In FIG. 7, signal 507 (shown with reversed edge) emanates once from source node 301 but is actually present on two upstream PIM output nodes, 326 and 336, and thus on two downstream PIM input nodes, shown as 513 and 533 in FIG. 9. Therefore, according to the present invention, the downstream PIM 204 routes each unique signal (from the output of upstream PIM 205) once and only once.

FIG. 9 illustrates the graph state representing the logic block PIM connections after successful routing of two unduplicated signals at input nodes 543 and 563 and one of two duplicate signals at node 533. Edge reversal at input node 533 to virtual node 1001 and then to source node 301 prevents the attempted routing of the other duplicate signal present at input node 513. With a solution including duplicate pathways prevented by edge reversal 1101, only three pathways 422 connect to three output nodes 526, 536 and 546 in output array set 506. Thus the three originally desired signals, and only those three signals, are routed into the logic block.

Figure 10:
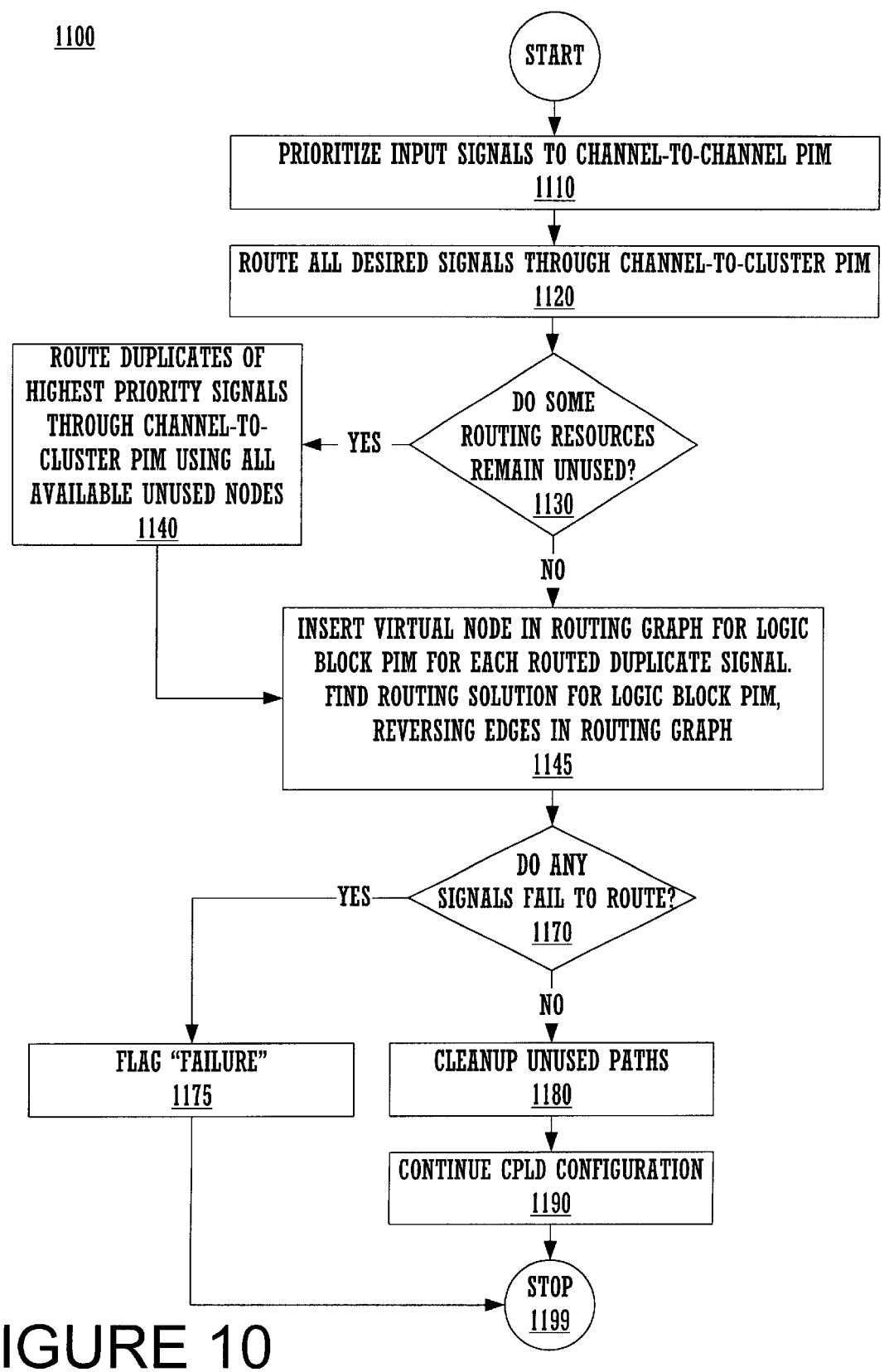
FIG. 10 illustrates the logical flow of a routing process in accordance with an embodiment of the present invention.

An embodiment of the routing process (1100) is visualized by reference to the flow chart in FIG. 10. The start and stop nodes in FIG. 10 link to the prior and subsequent software operations, respectively. In order, the signals input to channel-to-cluster PIM 205 are prioritized at block 1110. Routing priority can be given by signal importance, by user preference or by critical path or timing issues. The choice of prioritization criterion in this embodiment is the fan-out number of each signal.

All signals are routed through the channel-to-cluster PIM 205 at step 1120. If there are surplus routing resources available in the PIM, 1130, left over, as many duplicates of the highest priority signals as possible are routed through the PIM 205, using all available resources, at step 1140. During the routings for the PIM 205, the original signals are routed first (each is routed once and only once), then duplicates of the high priority signals (as many as possible) are routed by re-introducing high priority signals to existing input nodes of the graph and performing path finding steps to locate forward paths through the PIM 205 to additional output nodes, represented in the graph, for the duplicate signals. The outputs of the PIM 205 (original and duplicates) are then forwarded to the inputs of the PIM 204.

At step 1145, all signals are then routed through the logic block PIM 204. For each duplicate signal, a virtual node is inserted in a graph between the source node and input nodes, where the virtual node ensures that each duplicate signal is routed only once. The directed edge in the graph logically associated with each routed signal is reversed, 1145. Forward paths are determined through the graph to output nodes for each unique signal. At the completion of 1145, each unique signal output from PIM 205 is routed once and only once by PIM 204.

If any signal fails to route, 1170, routing failure occurs, 1175, and the routing process halts. If all signals route successfully, unused path resources are cleaned up, 1180, in order to stop any detriment they may have on device operation. The configuration process can then move on, 1190, 1199. The process is only successful when all signals are fully routed.

Further illustration of this process is presented in Table 1 as an example wherein the. above process is outlined in pseudo-code form.

TABLE 1

Overall Flow
    Create additional alternative routes for signals.
    Use alternative routes for signals in solving the "downstream" routing. Clean up any
    unused alternative routes to help reduce power and delay for routes that are unused
    Creating additional alternative routes for signals
        Set up and solve the usual bipartite graph matching problem using the maximal flow
        representation.
        If any signal is unable to route at least once, fail -- no feasible routing exists.
        Order the signals based on priority. For this implementation, the ordering criteria
        is fanout. Process each signal in order.
            For each ( signal in SignalByPriority ) {
                /* Note: each augmenting path represents a valid route */
                Attempt to locate an augmenting path.
                If (able to find an augmenting path) {
                      Associate the additional route with the signal.
                      /* Note: leave the flow graph updated with the
                          additional augmenting path */
                }
            }
    Use alternative signal routes in PIM routing and cleanup
        The key point is that the graph is modified to introduce an auxiliary intermediate
        node so it can be determined for which signal, route(s) are actually used in an
        efficient manner. The modified graph is illustrated in FIG. 9.
        Using the modified flow graph, solve the max flow problem where for each signal with
        alternative routes (in FIG. 9, for example, input nodes 513 and 533) a new auxiliary
        node 1001 is introduced between the source node 301 and the PIM input nodes 513 and
        533.
        If a full flow is achieved (that is, if every source output arc is used), then it
        indicates a successful route.

TABLE 1-continued

Perform cleanup by visiting each unused outgoing edge starting from each auxiliary node.
The following describes the above steps in pseudo-code:
    Set up a modified flow graph.
        where for each signal, (e.g. 507 in FIG. 7), with alternative
        routes (e.g. to output nodes 326 and 336 in FIG. 7 or input
        nodes 513 and 533 in FIG. 9), introduce a new auxiliary node 1001,
        with the source node 301 as input edge, and output edge going to PIM
        input nodes 513 and 533.
    Solve the max flow problem.
    If (not full flow) return FAILURE;
    For (each edge from PIM input node to PIM output node) {
        Mark the associated route in the PIM as being used; that
        is, configure the PIM to make the specified connection.
    }
    For (each auxiliary node) {
        For (each UNUSED outgoing edge) {
            Free up the associated unused route in the upstream PIM.
        }
        }
                      End of Table With the duplication of signals and subsequent interconnect matrix routing alternatives, this embodiment of the present invention reduces or eliminates routing failures in programmable logic device configuration. Therefore, an embodiment of a novel and useful method of routing signals in such devices has been described.

We claim:

1. A method for routing signals through programmable routing resources of a logic device comprising the steps of:
   a) determining high priority signals from a set of signals;
   b) routing each signal, of said set of signals, through a first programmable routing resource so that all signals, of said set of signals, are routed once through said first programmable routing resource;
   c) routing said high priority signals through said first programmable routing resource so that output pins of said first programmable routing resource contain duplicates of said high priority signals; and
   d) routing a set of signals defined on said output pins of said first programmable routing resource through a second programmable routing resource so that each unique signal is routed once, and only once, through said second programmable routing resource.

2. A method as described in claim 1 further comprising the step of supplying outputs of said second programmable routing resource to a programmable logic block of said logic device.

3. A method as described in claim 1 wherein said set of signals of said step a) are obtained from a channel resource within said logic device.

4. A method as described in claim 1 wherein said first programmable routing resource is a programmable interconnect matrix (PIM).

5. A method as described in claim 1 wherein said second programmable routing resource is a programmable interconnect matrix (PIM).

6. A method as described in claim 4 wherein said second programmable routing resource is a programmable interconnect matrix (PIM).

7. A method as described in claim 1 wherein said logic device is a Complex Programmable Logic device (CPLD).

8. A method as described in claim 1 wherein said step a) comprises the step of ranking said high priority signals based on the fanout number of each of said signals wherein signals with higher fanout numbers are assigned higher priority.

9. A method as described in claim 1 further comprising the step of removing any duplicate signals not routed.

10. In a system for programming a logic device, a method for routing signals through a programmable routing resource comprising the steps of:
    a) routing each signal, of a set of signals, through a first programmable routing resource so that all signals, of said set of signals, are routed exactly once, said step a) performed using a maximum bipartite matching process using maximum flow; and
    b) routing high priority signals through said first programmable routing resource using remaining routing resources such that output pins of said first programmable routing resource contain duplicate signals of said high priority signals, said step b) performed using an augmented maximum bipartite matching process comprising the steps of:
       b1) re-introducing said high priority signals to existing input nodes of the graph; and
       b2) performing path finding steps to locate forward paths through said first programmable routing resource to additional output nodes, represented in said graph, for said duplicate signals.

11. A method as described in claim 10 further comprising the steps of:
    c) routing a set of signals defined on said output pins of said first programmable routing resource through a second programmable routing resource so that each unique signal is routed once, and only once, through said second programmable routing resource.

12. A method as described in claim 10 wherein said first programmable routing resource is a programmable interconnect matrix (PIM).

13. A method as described in claim 11 wherein said second programmable routing resource is a programmable interconnect matrix (PIM).

14. A method as described in claim 10 wherein said logic device is a Complex Programmable Logic device (CPLD).

15. A method as described in claim 10 further comprising the step of determining said high priority signals from said set of signals, wherein said determining step comprises the step of ranking said set of high priority signals based on the fanout number of each of said signals wherein signals with higher fanout numbers are assigned higher priority.

16. A method as described in claim 10 further comprising the step of removing any duplicate signals not routed.

17. In a system for programming a logic device, a method for routing signals through a programmable routing resource comprising the steps of:
- a) routing each signal, of a set of signals, through a first programmable routing resource which outputs each signal and duplicate signals of high priority signals; and
- b) routing each unique signal output from said first programmable routing resource through a second programmable routing resource using an augmented maximum bipartite matching process comprising the steps of:
   - b1) for each duplicate signal, inserting a virtual node in a graph between the source node and input nodes, wherein said virtual node ensures that each duplicate signal is routed only once; and
   - b2) determining forward paths through said graph to output nodes for each unique signal.

18. A method as described in claim 17 further comprising the step of supplying outputs of said second programmable routing resource to a programmable logic block of said logic device.

19. A method as described in claim 17 wherein said first programmable routing resource is a programmable interconnect matrix (PIM).

20. A method as described in claim 17 wherein said second programmable routing resource is a programmable interconnect matrix (PIM).

21. A method as described in claim 17 wherein said logic device is a Complex Programmable Logic device (CPLD).

22. A method as described in claim 17 further comprising the step of determining said high priority signals from said set of signals, wherein said determining step comprises the step of ranking said set of high priority signals based on the fanout number of each of said signals wherein signals with higher fanout numbers are assigned higher priority.

23. A method as described in claim 17 further comprising the step of removing any duplicate signals not routed.

* * * * *